(12) United States Patent
Sekine et al.

(10) Patent No.: US 9,730,325 B2
(45) Date of Patent: *Aug. 8, 2017

(54) SUBSTRATE WITH BUILT-IN PASSIVE ELEMENT

(71) Applicant: NAPRA CO., LTD., Tokyo (JP)

(72) Inventors: Shigenobu Sekine, Tokyo (JP); Yurina Sekine, Tokyo (JP); Kazutoshi Kamibayashi, Tokyo (JP)

(73) Assignee: NAPRA CO., LTD., Tokyo (JP)

( * ) Notice: Subject to any disclaimer, the term of this patent is extended or adjusted under 35 U.S.C. 154(b) by 52 days.

This patent is subject to a terminal disclaimer.

(21) Appl. No.: 14/155,709

(22) Filed: Jan. 15, 2014

(65) Prior Publication Data

US 2014/0204548 A1   Jul. 24, 2014

(30) Foreign Application Priority Data

Jan. 24, 2013  (JP) .................................. 2013-011189

(51) Int. Cl.
*H05K 1/00* (2006.01)
*H05K 1/16* (2006.01)
(Continued)

(52) U.S. Cl.
CPC ............. *H05K 1/165* (2013.01); *H05K 1/162* (2013.01); *H05K 1/167* (2013.01);
(Continued)

(58) Field of Classification Search
CPC .. H05K 3/429; H05K 1/112; H05K 2201/096; H05K 3/4602; H05K 1/115; H05K 1/0373; H05K 1/0393; H05K 1/05; H05K 1/11; H05K 1/111; H05K 1/114; H05K 1/117; H05K 1/119; H05K 1/14; H05K 1/142; H05K 2201/09872; H05K 2201/10378; H05K 3/4691; H05K 24/50; H05K 1/027; H05K 2201/092; H05K 2201/095; H05K 2201/09509;
(Continued)

(56) References Cited

U.S. PATENT DOCUMENTS 6,000,339 A * 12/1999 Matsuzawa .......... C09D 183/14
   106/287.14
6,856,501 B2 * 2/2005 Matsuhashi ............. H01L 28/75
   257/E21.011

(Continued)

FOREIGN PATENT DOCUMENTS

JP   09-214090 A    8/1997
JP   2007-220943 A  8/2007

*Primary Examiner* — Pete Lee
(74) *Attorney, Agent, or Firm* — Westerman, Hattori, Daniels & Adrian, LLP

(57) ABSTRACT

A substrate with built-in passive element includes passive elements and a substrate. The passive elements include at least one of a capacitor, an inductor, a resistor, a signal transmission element or an optical waveguide element. The capacitor, the inductor, the resistor, the signal transmission element or the optical waveguide element has a functional element filled in a groove-like or hole-like element forming region provided in the substrate along a thickness direction thereof. The functional element has a Si—O bond region obtained by reacting Si particles with an organic Si compound.

6 Claims, 15 Drawing Sheets

(51) Int. Cl.
*H05K 1/03* (2006.01)
*H05K 3/40* (2006.01)

(52) U.S. Cl.
CPC .... *H01L 2924/0002* (2013.01); *H05K 1/0306* (2013.01); *H05K 3/4061* (2013.01); *H05K 2201/086* (2013.01)

(58) Field of Classification Search
CPC .......... H05K 2201/09518; H05K 2201/09527; H05K 2201/09536; H05K 2201/09545; H05K 2201/09554; H05K 2201/09581; H05K 2201/09609; H05K 2201/09618; H05K 2201/09636; H05K 2201/09809; H05K 2201/09818; H05K 2201/09827; H05K 2201/09836; H05K 2201/09845; H05K 2201/09854; H05K 2201/09863; H05K 3/4061; H05K 3/4069; H05K 2201/0154; H05K 2201/0158; H05K 2201/0162; H05K 2201/0166; H05K 2201/017; H05K 2201/0175; H05K 2201/0179; H05K 2201/0183; H05K 2201/0187; H05K 2201/0191; H05K 2201/0195; H05K 23/5226; H05K 1/0206; H05K 1/165; H05K 2924/0002; H05K 1/162; H05K 1/167; H05K 2201/086; H05K 1/0277; H05K 1/028; H05K 1/0281; H05K 1/0283; H05K 1/118; H05K 1/147; H05K 1/148; H05K 1/189; H05K 2201/042; H05K 2201/046; H05K 2201/05; H05K 1/03; H05K 1/053; H05K 1/056; H05K 2201/0738; H05K 1/09; H05K 1/092; H05K 1/095; H05K 1/097; H05K 2201/0133; H05K 2201/02; H05K 2201/0203; H05K 2201/0206; H05K 2201/0209; H05K 2201/0212; H05K 2201/0215; H05K 2201/0218; H05K 2201/0221; H05K 2201/0224; H05K 2201/0227; H05K 2201/023; H05K 2201/0233; H05K 2201/0236; H05K 2201/0239; H05K 2201/0272; H05K 2201/0323; H05K 2201/0326; H05K 2201/0329; H05K 2201/051; H05K 1/0306; H05K 1/0313; H05K 1/0353; H05K 1/038; H05K 1/0386; H05K 2201/0141; H05K 2201/0145; H05K 2201/015; H05K 1/0221; H05K 1/0222; H05K 1/0225; H05K 1/0251; H05K 1/116; H05K 2201/09063; H05K 2201/09072; H05K 2201/0919; H01L 23/5226; H01L 2924/0002
USPC ............... 174/255–265; 361/311, 303, 301.4
See application file for complete search history.

(56) References Cited

U.S. PATENT DOCUMENTS

| | | | |
|---|---|---|---|
| 6,897,508 B2* | 5/2005 | Sneh | H01L 27/10861 257/301 |
| 7,436,069 B2* | 10/2008 | Matsui | H01L 23/481 257/302 |
| 9,076,786 B2* | 7/2015 | Sekine | H01L 21/76879 |
| 2007/0139860 A1* | 6/2007 | Hoerpel | H01G 9/02 361/311 |
| 2007/0287012 A1* | 12/2007 | Kawai | C03C 3/062 428/427 |
| 2009/0244808 A1* | 10/2009 | Ohtsuka | H01G 4/33 361/311 |
| 2010/0300740 A1* | 12/2010 | Ichiyanagi | H01G 4/232 174/260 |
| 2012/0146182 A1* | 6/2012 | Oganesian | H01L 23/481 257/532 |

* cited by examiner

SUBSTRATE WITH BUILT-IN PASSIVE ELEMENT

BACKGROUND OF THE INVENTION

1. Field of the Invention

The present invention relates to a substrate with built-in passive elements such as a capacitor, an inductor, a resistor, a signal transmission element or an optical waveguide element.

2. Description of the Related Art

In the technical field of electronic component packaging, the 3D packaging is rapidly becoming mainstream instead of the conventional SMT (surface mount technology). Particularly, owing to an increasing demand for miniaturization, high speed and low power consumption, there has been a remarkable progress in the 3D-SiP technology, where the 3D packaging is combined with SiP (system in package) in which a system composed of a plurality of LSIs is enclosed in a single package. The SiP also has an advantage in reducing the power consumption, shorting the development times and reducing the cost. The integration of an advanced system can be achieved by the combination of the SiP and the 3D packaging which enables high density packaging.

As an essential technology for the above-mentioned 3D packaging, there has been known a TSV (through silicon via) technology. By using the TSV technology, a great deal of functionality can be packed into a small footprint, and critical electrical paths through the device can be drastically shortened, leading to faster operation.

However, when the operation is made faster by using the TSV (through silicon via) technology, for example, switching noise generated in a semiconductor chip may cause a malfunction of the integrated circuit. As a countermeasure against it, for example, it is effective to filter the noise by disposing a passive element such as a capacitor, an inductor or a resistor between a power bus line and a ground bus line. In this case, it is a common practice to additionally mount a finished passive component on or outside a multilayer circuit board.

However, if a capacitor is mounted on the circuit board as an additional component, the wiring inductance increases because of a large connection distance between the capacitor and the semiconductor chip, impairing the advantage of the TSV technology.

In order to deal with these problems, Japanese Unexamined Patent Application Publication No. 2007-220943 discloses a wiring circuit board having passive elements built therein, in which a pattern electrode is formed on a first thin-film multilayer wiring layer formed on one surface of a silicon substrate, and a thick-film passive element film is connected to the pattern electrode, and then, a second thin-film multilayer wiring layer is formed so as to cover the above members. The first thin-film multilayer wiring layer or the second thin-film multilayer wiring layer contains a thin-film passive element film.

In Japanese Unexamined Patent Application Publication No. 2007-220943, however, since the first thin-film multilayer wiring layer, the thick-film pattern electrode, the thick-film passive element film, the second thin-film multilayer wiring layer and the thin-film passive element film are formed on the silicon substrate, the entire thickness of the wiring circuit board having passive elements built therein inevitably becomes large.

Moreover, since the planar passive elements are arranged on the substrate, it is difficult to arrange the passive elements at high density. Therefore, it is less suitable for the TSV technology intended for high-density packaging.

SUMMARY OF THE INVENTION

It is an object of the present invention to provide a thin substrate in which built-in passive elements are arranged at high density.

In order to attain the above object, a substrate with built-in passive element according to the present invention comprises passive elements and a substrate. The passive element has a functional element filled in a groove-like or hole-like element forming region provided in the substrate along a thickness direction thereof.

The term "functional element" as used herein refers to an essential part necessary for serving the function of a passive element. In the present invention, examples of the passive element include a capacitor, a resistor, an inductor, a signal transmission element and an optical waveguide element. Also, examples of the functional element include a conductor, a ferroelectric element, a resistive element, an electrical insulator, a magnetic element and an optical waveguide. When the passive element is a capacitor, the conductor serves as a functional element of a capacitor electrode; when the passive element is an inductor or a signal transmission element, the conductor serves a functional element of an electrical signal transmission element. The resistive element serves as a functional element of a resistor. When the passive element is a capacitor, the ferroelectric layer serves as a functional element of an inter-electrode capacitance layer. When the substrate is a semiconductor substrate such as Si substrate or a conductive substrate, the insulator serves as a functional element for electrically insulating other functional elements from the substrate. The magnetic element serves as a functional element for improving magnetic efficiency of an inductor or the like. The optical waveguide serves as a functional element for forming an optical waveguide element in the substrate.

In the present invention, since the functional element of the passive element is filled in the groove-like or hole-like element forming region provided in the substrate along its thickness direction, the built-in passive element does not increase the thickness of the substrate. Thus, there can be obtained a thin substrate with built-in passive element.

Moreover, since the functional element is filled in the groove-like or hole-like element forming region provided in the substrate along its thickness direction, the passive element can be formed by utilizing the thickness of the substrate. Therefore, unlike the related art in which planar passive elements are arranged on the substrate, the passive elements can be arranged at high density. Hence, it is highly suitable for the TSV technology intended for high-density packaging.

The substrate may be either an organic substrate or an inorganic substrate. Also, the substrate may be either an insulating substrate or a conductive substrate, e.g., a semiconductor substrate such as Si substrate. When the substrate has conductivity, the conductor, the resistive element, etc. serving as a functional element can be electrically insulated from the substrate by the electrical insulating layer also serving as a functional element. In this case, the electrical insulating layer may have insulating particles and a Si—O bond region filling up the space around the insulating particles.

When the passive elements include a capacitor, the ferroelectric layer serving as a functional element of the capacitor may have ferroelectric particles and a Si—O bond region filling up the space around the ferroelectric particles.

When the passive elements include at least one of an inductor or a signal transmission element, the conductor serving as a functional element of the inductor or the signal transmission element may contain a high-melting-point metallic component and a low-melting-point metallic component. The inductor may have any pattern such as a straight pattern, a zigzag pattern, a meandering pattern, a helical pattern or a spiral pattern. It is also possible use a magnetic element for the functional element, thereby improving magnetic efficiency. When the passive element is an optical waveguide element, furthermore, an optical fiber may be formed in the substrate along its thickness direction. The substrate with built-in passive element according to the present invention is not limited to those having only passive elements built therein but may also include an active element.

According to the present invention, as has been described above, there can be provided a thin substrate in which built-in passive elements are arranged at high density. Therefore, the present invention can provide a thin substrate with built-in passive element which is highly suitable for the TSV technology intended for high-density packaging.

The present invention will be more fully understood from the detailed description given hereinbelow and the accompanying drawings which are given by way of illustration only, and thus not to be considered as limiting the present invention.

DESCRIPTION OF THE PREFERRED EMBODIMENTS

Figure 1:
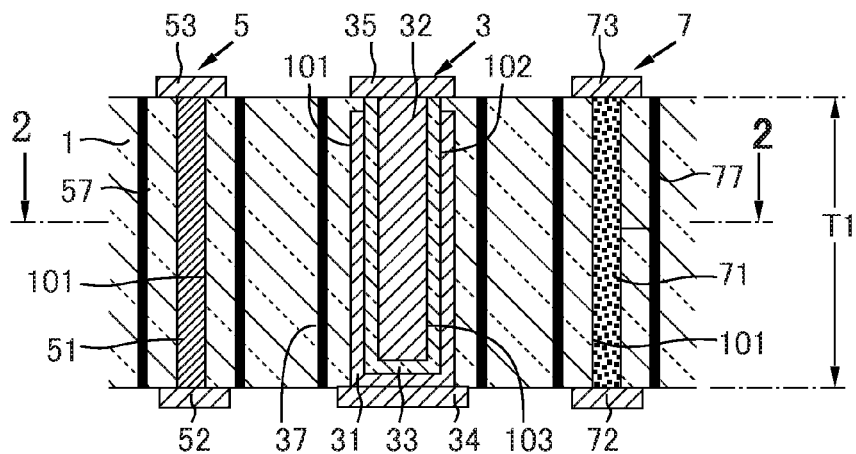
FIG. 1 is a sectional view showing a part of a substrate with built-in passive element according to the present invention.
Figure 2:
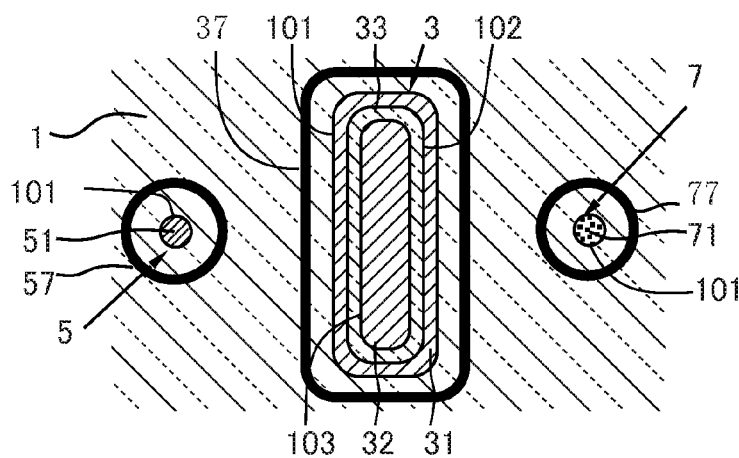
FIG. 2 is a sectional view taken along the line 2-2 in FIG. 1.
Figure 3:
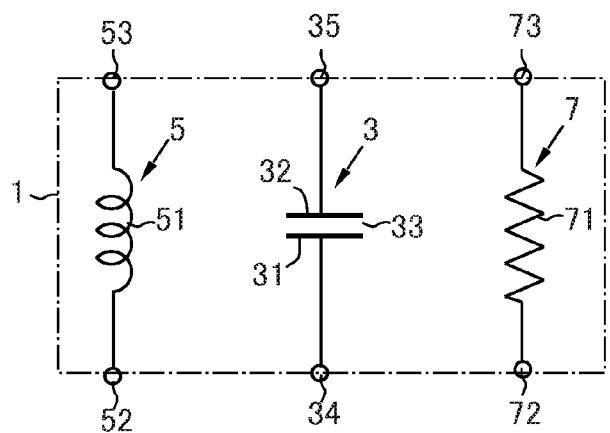
FIG. 3 is a drawing in which the substrate shown in FIGS. 1 and 2 is depicted as a circuit diagram of passive elements built therein.

Referring to FIGS. 1 to 3, a substrate with built-in passive element according to the present invention includes a substrate 1 and passive elements 3, 5 and 7. The substrate 1 has a flat shape with a thickness T1. The substrate 1 may be any of an insulator, a dielectric body, a magnetic body, a semiconductor, a conductor or a combination thereof. Also, it may be an organic substrate, an inorganic substrate or a combination thereof. In this embodiment, for instance, the substrate 1 is an inorganic insulator.

Typically, the passive elements 3, 5 and 7 may be a capacitor, an inductor, a resistor or a combination thereof. They may also be a signal transmission line or an optical waveguide element. Depending on the type, functional elements of such passive elements include at least one of a conductor, a resistive element, a dielectric element, an insulator, a magnetic element or an optical waveguide. In all embodiments described below, although not shown in the drawings, the substrate 1 may also be provided with an active element such as semiconductor circuit.

In FIGS. 1 to 3, the passive element 3 is a capacitor, the passive element 5 is an inductor, and the passive element 7 is a resistor. The type, number, sectional shape and pattern of the passive elements 3, 5 and 7 may be selected arbitrarily. Although the passive elements 3, 5 and 7 are independent of each other, they may be connected to each other if such a circuit configuration is required. The interconnection of the passive elements 3, 5 and 7 may be effected either inside the substrate 1 or outside the substrate 1.

The capacitor 3 includes a first capacitor electrode 31, a ferroelectric layer 33 and a second capacitor electrode 32 as a functional element thereof. The first capacitor electrode 31 fills up a groove-like or hole-like first element forming region 101 provided in the substrate 1 along its thickness direction, the ferroelectric layer 33 fills up a groove-like or hole-like second element forming region 102 provided in the first capacitor electrode 31, and the second capacitor electrode 32 fills up a groove-like or hole-like third element forming region 103 provided in the ferroelectric layer 33.

As seen in a plan view (FIG. 2), the first capacitor electrode 31 has an elongated rectangular shape, and the ferroelectric layer 33 and the second capacitor electrode 32 embedded therein also have an elongated rectangular shape. The bottom (directed downward in FIG. 1) of the first capacitor electrode 31 appears on the lower surface of the substrate 1, and a first terminal electrode 34 is disposed thereon. The upper end (in FIG. 1) of the first capacitor electrode 31 is located at a distance from the upper surface of the substrate 1, staying within the substrate 1. Through the ferroelectric layer 33, the second capacitor electrode 32 faces the first capacitor electrode 31 at the bottom surface (directed downward in FIG. 1) and the entire side surface, and a second terminal electrode 35 is disposed on the top surface appearing on the upper surface of the substrate 1.

With the above-described structure, as shown in FIG. 3, there can be obtained a capacitor in which capacitance due to the first capacitor electrode 31, the second capacitor electrode 32 and the ferroelectric layer 33 can be taken out from the first terminal electrode 34 and the second terminal electrode 35.

Figure 4:
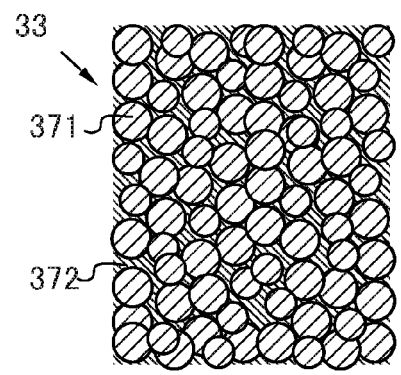
FIG. 4 is a drawing showing a microscopic structure of an electrical insulating layer or a conductor built in the substrate shown in FIGS. 1 to 3.

As conceptually shown in FIG. 4, the ferroelectric layer 33 serving as a functional element of the capacitor 3 may have ferroelectric particles 371 and a Si—O bond region 372 filling up the space around the ferroelectric particles 371. Also, the first capacitor electrode 31 and the second capacitor electrode 32 may contain a high-melting-point metallic component and a low-melting-point metallic component. In this case, a structure in which the high-melting-point metallic component 371 serves as an aggregate and the low-melting-point metallic component 371 fills up the space around the aggregate can be obtained by applying the technical idea shown in FIG. 4.

Moreover, as a functional element, the inductor 5 has a conductor 51 filled in a first element forming region 101 provided in the substrate 1 along its thickness direction. Opposite ends of the conductor 51 appear on opposite surfaces of the substrate 1 in the thickness direction, and terminal electrodes 52 and 53 are bonded to the exposed opposite ends. Therefore, as shown in FIG. 3, there can be obtained an inductor in which inductance due to the conductor 51 can be taken out from the terminal electrodes 52 and 53. It should be noted that the inductor may also be used as a signal transmission element.

The conductor 51 serving as a functional element of the inductor (or signal transmission element) 5 may contain a high-melting-point metallic component and a low-melting-point metallic component. The conductor 51 may have any pattern such as a straight pattern, a zigzag pattern, a meandering pattern, a helical pattern or a spiral pattern. It is also possible to use a magnetic element for the functional element, thereby improving magnetic efficiency.

Furthermore, as a functional element, the resistor 7 has a resistive element 71 filled in a first element forming region 101 provided in the substrate 1 along its thickness direction. Opposite ends of the resistive element 71 appear on opposite surfaces of the substrate 1 in the thickness direction, and terminal electrodes 72 and 73 are bonded to the exposed opposite ends. Therefore, as shown in FIG. 3, there can be obtained a resistor 7 in which electrical resistance due to the resistive element 71 can be taken out from the terminal electrodes 72 and 73. The resistive element 71 may be formed of a known resistive material. The resistive element 71 may have any pattern such as a straight pattern, a zigzag pattern, a meandering pattern, a helical pattern or a spiral pattern.

As described above, the first capacitor electrode 31, the ferroelectric layer 33 and the second capacitor electrode 32 serving as a functional element of the capacitor 3 are embedded in the substrate 1 along its thickness direction. The conductor 51 serving as a functional element of the inductor 5 is also filled in the element forming region provided in the substrate 1 along its thickness direction. Moreover, the resistive element 71 serving as a functional element of the resistor 7 is also filled in the first element forming region 101 provided in the substrate 1 along its thickness direction. Therefore, the capacitor 3, the inductor 5 and the resistor 7 built therein do not increase the thickness of the substrate 1. Thus, there can be obtained a thin substrate 1 with built-in passive element.

Furthermore, since the first capacitor electrode 31, the ferroelectric layer 33 and the second capacitor electrode 32 serving as a functional element of the capacitor 3, the conductor 51 serving as a functional element of the inductor 5, and the resistive element 71 serving as a functional element of the resistor 7 are filled in the first element forming regions 101 provided in the substrate 1 along its thickness direction, the passive elements 3, 5 and 7 can be formed by utilizing the thickness of the substrate 1. Therefore, unlike the related art in which planar passive elements are arranged on the substrate, the passive elements 3, 5 and 7 can be arranged at high density. Hence, it is highly suitable for the TSV technology intended for high-density packaging.

The capacitor 3, the inductor 5 and the resistor 7 may be surrounded by ring-shaped electromagnetic shield layers 37, 57 and 77, respectively. Although not mentioned below, similar electromagnetic shield layers may also be provided in the following embodiments.

Figure 5:
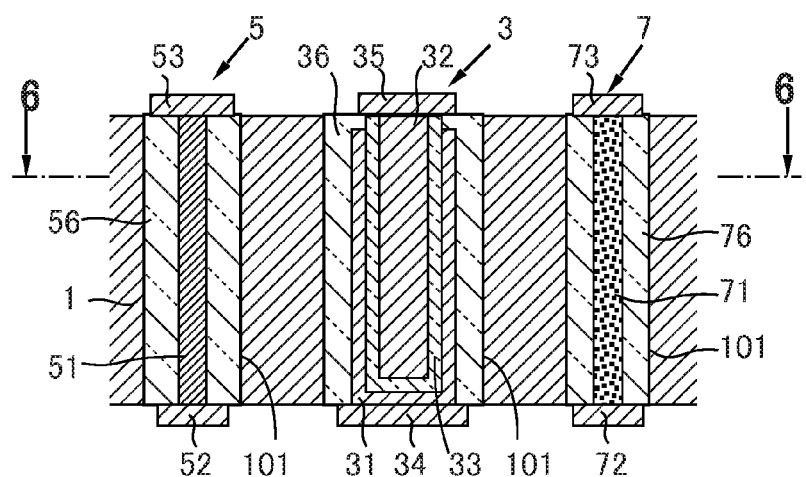
FIG. 5 is a drawing showing another embodiment of a substrate with built-in passive element according to the present invention.
Figure 6:
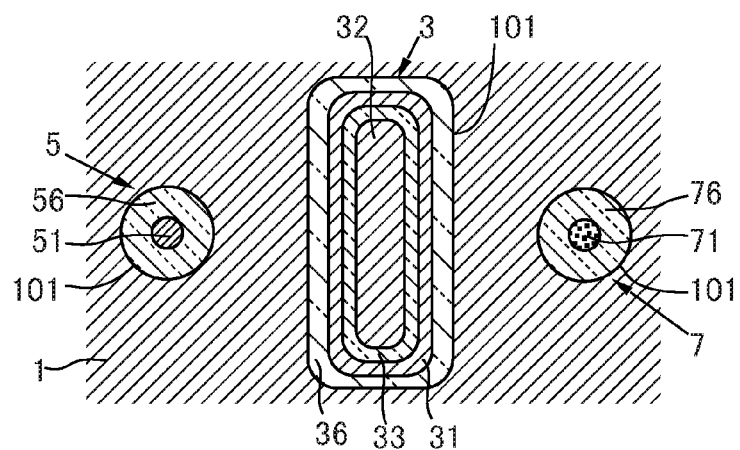
FIG. 6 is a sectional view taken along the line 6-6 in FIG. 5.

Referring next to FIGS. 5 and 6, there is disclosed a specific structure in which the substrate 1 is formed of a conductive material, for example, a semiconductor substrate such as Si substrate. In FIGS. 5 and 6, the same components as those shown in FIGS. 1 to 3 are denoted by the same reference symbols and duplicate explanations are omitted. In the present embodiment, since the substrate 1 is formed of a conductive material, the first capacitor electrode 31 is covered with a ring-shaped electrical insulating layer 36 so as to electrically insulate the first capacitor electrode 31, the ferroelectric layer 33 and the second capacitor electrode 32 serving as a functional element of the capacitor 3 from the substrate 1. The electrical insulating layer is formed by filling an electrical insulating material into the first element forming region 101 provided in the conductive substrate 1.

In order to electrically insulate the conductor 51 serving as a functional element of the inductor 5 from the substrate 1, the conductor 51 is also covered with a ring-shaped electrical insulating layer 56. In order to electrically insulate the resistive element 71 serving as a functional element of the resistor 7 from the substrate 1, moreover, the resistive element 71 is also covered with a ring-shaped electrical insulating layer 76.

The above-mentioned electrical insulating layers 36, 56 and 76 are formed by filling an electrical insulating material into the first element forming region 101 formed in the conductive substrate 1. One of the effective methods for forming the electrical insulating layers 36, 56 and 76 is such that insulating particles and a fluid functional material for forming a Si—O bond region filling up the space around the insulating particles are filled into the first element forming region 101 and then hardened.

Other examples of the passive elements are further shown in FIGS. 7 to 33. However, the passive elements shown in the drawings are mere examples and should not be construed as limited thereto. Furthermore, depending on the required circuit configuration, the same type of passive elements may be connected in parallel or in series in a single substrate, or different types of passive elements may be arranged independently of each other or connected in parallel or in series in a single substrate. The interconnection of the passive elements may be effected either inside the substrate or outside the substrate.

(Capacitor)

Figure 7:
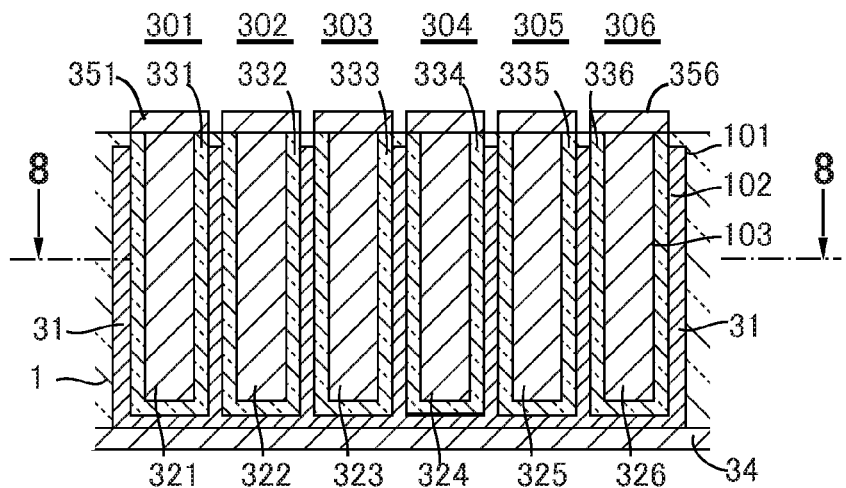
FIG. 7 is a drawing showing still another embodiment of a substrate with built-in passive element according to the present invention.
Figure 8:
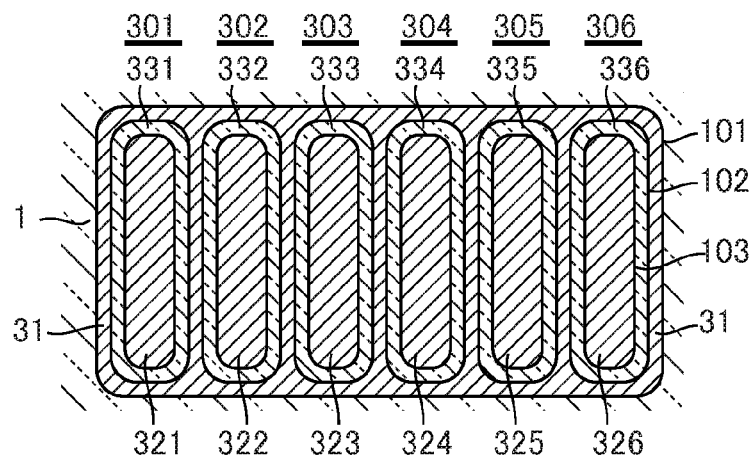
FIG. 8 is a sectional view taken along the line 8-8 in FIG. 7.
Figure 9:
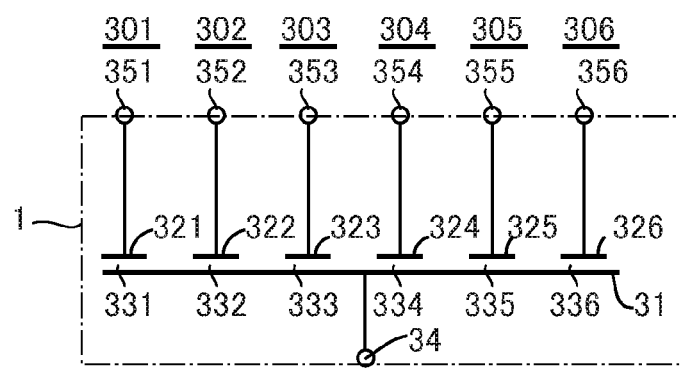
FIG. 9 is a drawing in which the substrate shown in FIGS. 7 and 8 is depicted as a circuit diagram of passive elements built therein.

The substrate with built-in passive element shown in FIGS. 7 to 9 includes a plurality of capacitors 301 to 306. In each of the capacitors 301 to 306, a first capacitor electrode 31 serving as a functional element thereof fills a groove-like or hole-like first element forming region 101 provided in the substrate along its thickness direction. Unlike those shown in FIGS. 1 to 5, the first capacitor electrode 31 horizontally extends to such an extent that it can be shared by the capacitors 301 to 306. In the first capacitor electrode 31 having such a large plane area, a plurality of groove-like or hole-like second element forming regions 102 are provided at small intervals, and ferroelectric layers 331 to 336 are filled in the respective second element forming regions 102. Then, third element forming regions 103 are provided in the respective ferroelectric layers 331 to 336 thus formed, and second capacitor electrodes 321 to 326 are filled in the third element forming regions 103.

The bottom (directed downward in FIG. 7) of the first capacitor electrode 31 appears on the lower surface of the substrate 1, and a first terminal electrode 34 is disposed thereon. The upper end (in FIG. 7) of the first capacitor electrode 31 is located at a distance from the upper surface of the substrate 1, staying within the substrate 1. Through the ferroelectric layers 331 to 336, the second capacitor electrodes 321 to 326 face the first capacitor electrode 31 at the bottom surface (directed downward in FIG. 7) and the entire side surface, and second terminal electrodes 351 to 356 are disposed on the respective top surfaces appearing on the upper surface of the substrate 1.

With the above-described structure, as shown in FIG. 9, there can be obtained a capacitor in which capacitance due to the ferroelectric layers 331 to 336 can be taken out from the respective second terminal electrodes 351 to 356, where the first capacitor electrode 31 serves as a common electrode.

The ferroelectric layers 331 to 336 serving as a functional element of the capacitors 301 to 306 may have ferroelectric particles and a Si—O bond region filling up the space around the ferroelectric particles (see FIG. 4). Also, the first capacitor electrode 31 and the second capacitor electrodes 321 to 326 may contain a high-melting-point metallic component and a low-melting-point metallic component. The first capacitor electrode 31 may be formed of a metallic member.

Figure 10:
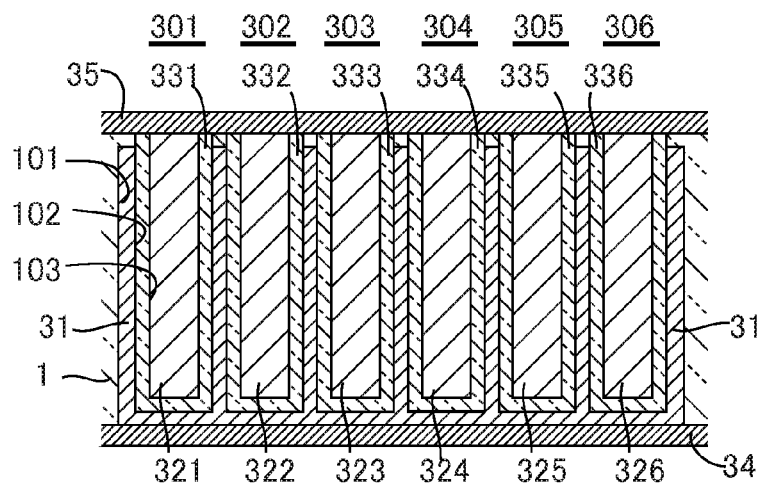
FIG. 10 is a drawing showing yet another embodiment of a substrate with built-in passive element according to the present invention.

FIG. 10 shows another embodiment in which, in addition to the first terminal electrode 34, a second terminal electrode 35 is also provided as a common electrode for the second capacitor electrodes 321 to 326, thereby forming a parallel capacitor circuit between the first terminal electrode 34 and the second terminal electrode 35.

Figure 11:
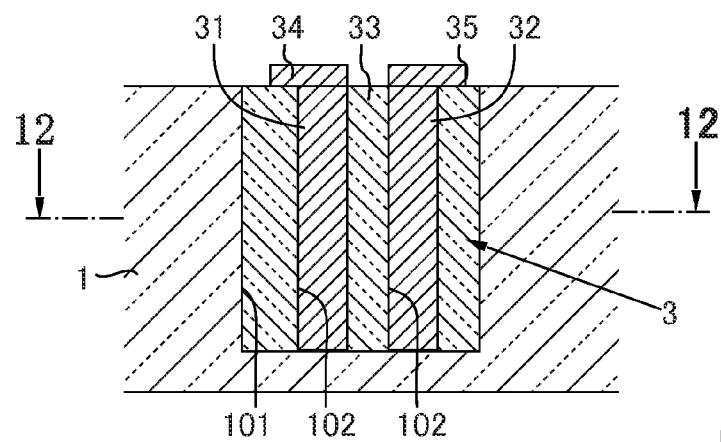
FIG. 11 is a drawing showing yet another embodiment of a substrate with built-in passive element according to the present invention.
Figure 12:
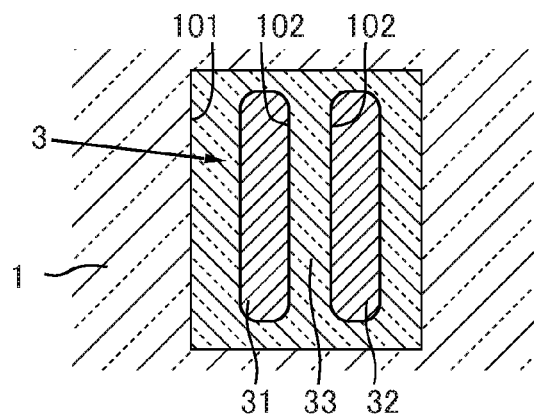
FIG. 12 is a sectional view taken along the line 12-12 in FIG. 11.
Figure 13:
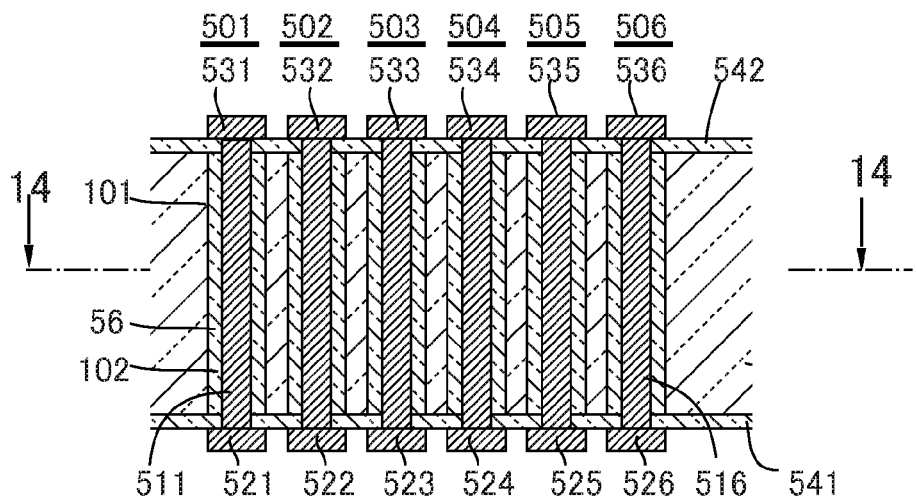
FIG. 13 is a drawing showing yet another embodiment of a substrate with built-in passive element according to the present invention.
Figure 14:
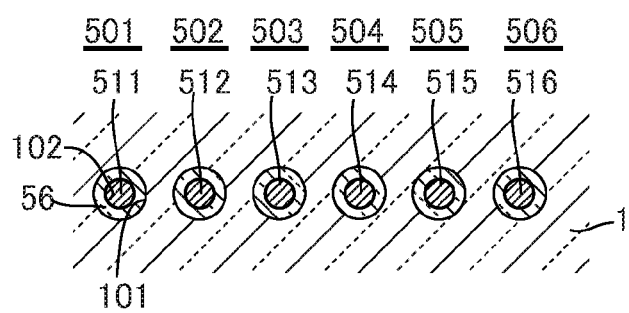
FIG. 14 is a sectional view taken along the line 14-14 in FIG. 13.
Figure 15:
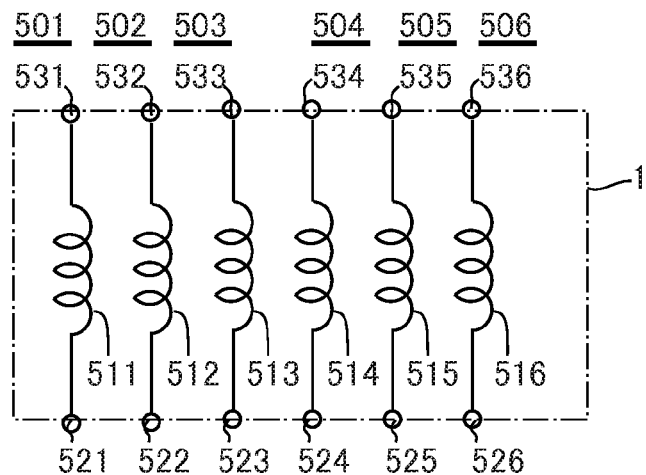
FIG. 15 is a drawing in which the substrate shown in FIGS. 13 and 14 is depicted as a circuit diagram of passive elements built therein.

FIGS. 11 and 12 show still another embodiment in which a first element forming region 101 is provided in the substrate 1 along its thickness direction, and a ferroelectric layer 33 is filled in the first element forming region 101. Then, two second element forming regions 102 separated from each other are provided in the ferroelectric layer 33 along its thickness direction, and a first capacitor electrode 31 and a second capacitor electrode 32 are filled in the respective second element forming regions 102.

Also in the embodiments shown in FIGS. 7 to 12, the first capacitor electrode 31, the ferroelectric layers 33, 331 to 336 and the second capacitor electrodes 32, 321 to 326 serving as a functional element of the capacitors 301 to 306 are embedded in the substrate 1 along its thickness direction. Therefore, the built-in capacitor does not increase the thickness of the substrate 1. Thus, there can be obtained a thin substrate 1 with built-in passive element.

Moreover, since the first capacitor electrode 31, the ferroelectric layers 33, 331 to 336 and the second capacitor electrodes 32, 321 to 326 serving as a functional element of the capacitor 3 are filled in the first element forming region 101 provided in the substrate 1 along its thickness direction, the capacitor can be formed by utilizing the thickness of the substrate 1. Therefore, unlike the related art in which planar passive elements are arranged on the substrate, the capacitors can be arranged at high density. Hence, it is highly suitable for the TSV technology intended for high-density packaging.

(Inductor)

FIGS. 13 to 23 show embodiments of a substrate with built-in inductor. In the embodiment shown in FIGS. 13 to 15, at first, a plurality of inductors 501 to 506 are arranged at small intervals in a conductive substrate 1 such as Si substrate. The inductors 501 to 506 are constructed such that groove-like or hole-like first element forming regions 101 are provided at intervals to pass through the substrate 1 in the thickness direction, electrical insulating layers 56 are filled in the first element forming regions 101, and conductors 511 to 516 are further filled in second element forming regions 102 provided in the electrical insulating layers. Opposite surfaces of the substrate 1 are covered with electrical insulating layers 541 and 542, where opposite ends of the conductors 511 to 516 appearing on the surface of the electrical insulating layers 541 and 542 are connected to first terminal electrodes 521 to 526 and second terminal electrodes 531 to 536 at the surface of the electrical insulating layers 541 and 542. Therefore, inductance due to the conductors 511 to 516 can be obtained between the first terminal electrodes 521 to 526 and the second terminal electrodes 531 to 536.

Figure 16:
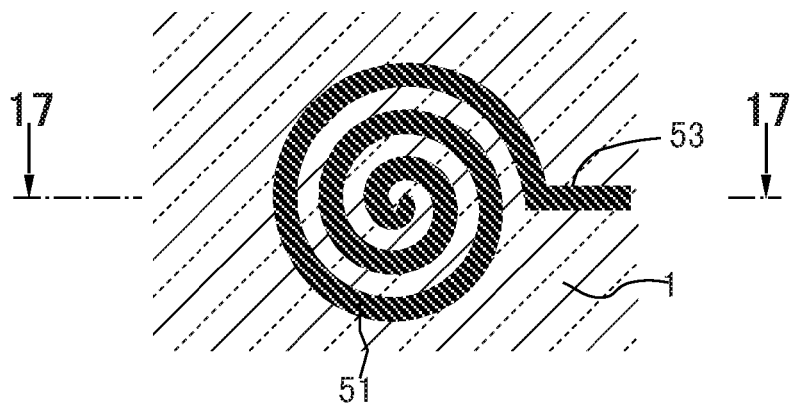
FIG. 16 is a drawing showing yet another embodiment of a substrate with built-in passive element according to the present invention.
Figure 17:
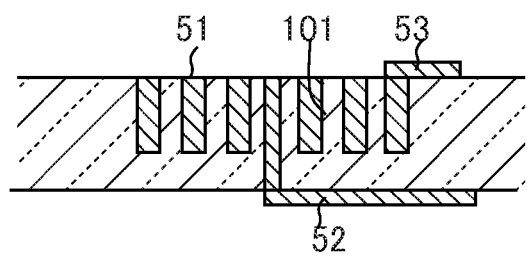
FIG. 17 is a sectional view taken along the line 17-17 in FIG. 16.
Figure 18:
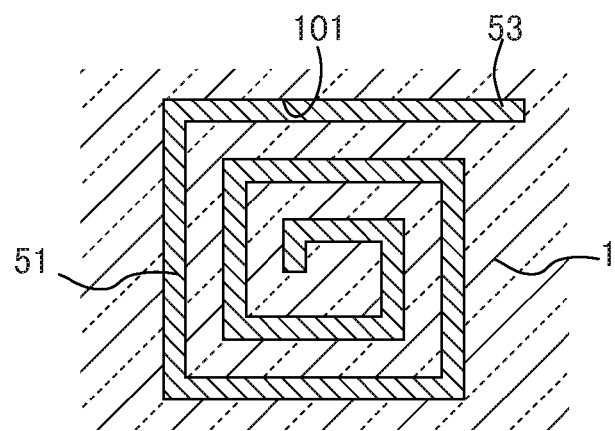
FIG. 18 is a drawing showing yet another embodiment of a substrate with built-in passive element according to the present invention.

In the next embodiment shown in FIGS. 16 to 18, the surface of the substrate 1 is recessed in the thickness direction to provide a spiral-shaped first element forming region 101 reaching a specified depth, where a conductor 51 serving as a functional element is filled in the first element forming region 101. The inner end of the conductor 51 passing through the substrate 1 from the upper surface to the lower surface at the center of the spiral is connected to a first terminal electrode 52 disposed at the lower surface. The outer end of the conductor 51 is connected to a second terminal electrode 53 disposed at the upper surface of the substrate 1. When the substrate 1 has conductivity, the conductor 51, the first terminal electrode 52 and the second terminal electrode 53 may be electrically insulated from the substrate 1 by an electrical insulating layer, as described above. The conductor 51 may be of an angular spiral shape as shown in FIG. 18.

Also in the embodiments shown in FIGS. 13 to 18, the conductors 51, 511 to 516 serving as a functional element of the inductors are embedded in the substrate 1 along its thickness direction. Therefore, the built-in inductor does not increase the thickness of the substrate 1. Thus, there can be obtained a thin substrate 1 with built-in inductor.

Moreover, since the conductors 51, 511 to 516 serving as a functional element of the inductors are filled in the first element forming region 101 provided in the substrate 1 along its thickness direction, the conductors 51, 511 to 516 serving as a functional element can be formed by utilizing the thickness of the substrate 1. Therefore, unlike the related art in which planar passive elements are arranged on the substrate, the conductors 51, 511 to 516 serving as a functional element can be arranged at high density. Hence, it is highly suitable for the TSV technology intended for high-density packaging.

Figure 19:
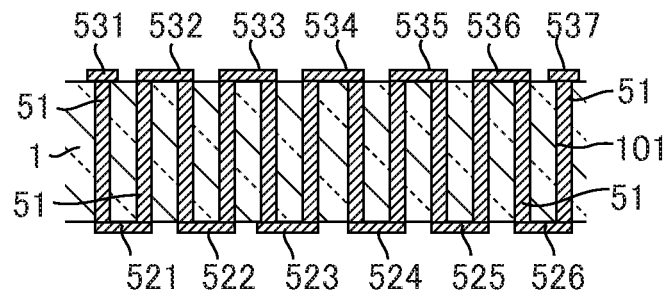
FIG. 19 is a drawing showing yet another embodiment of a substrate with built-in passive element according to the present invention.
Figure 20:
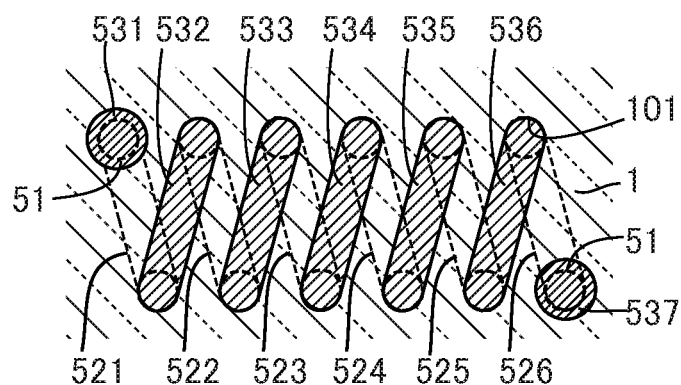
FIG. 20 is a plan view of the substrate with built-in passive element shown in FIG. 19.

Referring next to FIGS. 19 and 20, there is shown a substrate 1 with a built-in inductor 5 having a coil-shaped conductor 51. In the substrate 1, hole-like first element forming regions 101 passing through it in the thickness direction are arranged in two rows at small intervals. Each first minute space 101 is filled with the conductor 51 passing through the substrate 1 in the thickness direction. Between the rows, the ends of the conductors 51 are connected to each other one by one through connecting conductors 521 to 526 and 532 to 536 disposed on opposite surfaces of the substrate 1, thereby providing a coil-shaped conductor terminating at terminal electrodes 531 and 537. It is apparent that high inductance can be obtained by such a coil-shaped conductor.

Figure 21:
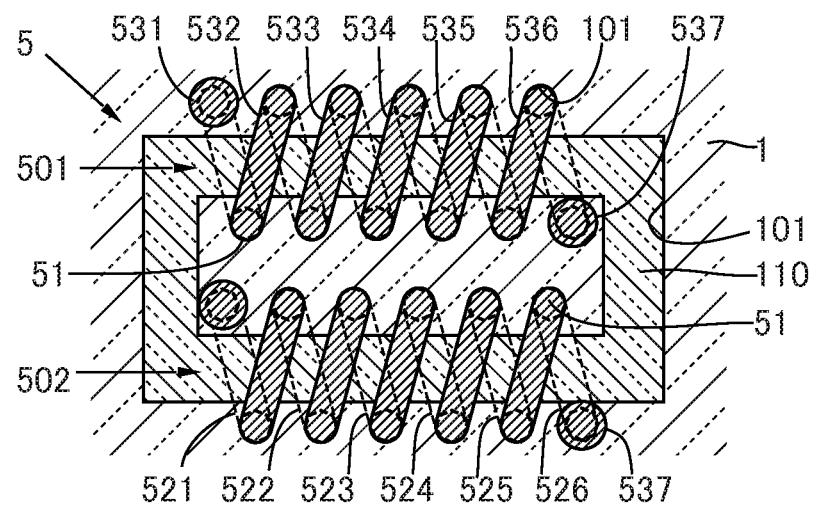
FIG. 21 is a drawing showing yet another embodiment of a substrate with built-in passive element according to the present invention.
Figure 22:
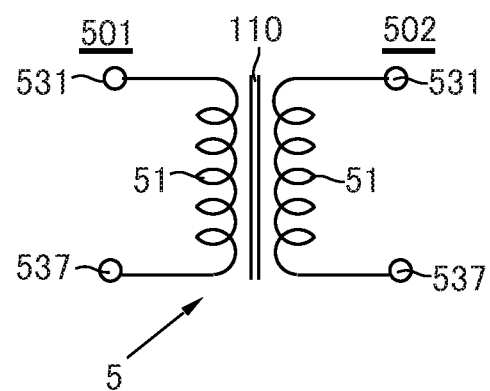
FIG. 22 is an electrical equivalent circuit diagram of passive elements built in the substrate shown in FIG. 21.

In FIGS. 21 and 22, there is shown an embodiment in which a magnetic element 110 is filled in a ring-shaped first element forming region 101 provided in the substrate 1 along its thickness direction, and two coil-shaped conductors 501 and 502 having the same structure as shown in FIGS. 19 and 20 are combined with the magnetic element 110. The two coil-shaped conductors 501 and 502 are wound around the magnetic element 110. Such an inductor 5 is generally a transformer or a choke coil. The magnetic element 110 may have, but not limited to, magnetic particles and a Si—O bond region filling up the space around the magnetic particles.

In the substrate with built-in passive element shown in FIGS. 21 and 22, the inductor 5 can be provided with an extremely high magnetic efficiency. In addition, such a built-in inductor 5 does not increase the thickness of the substrate 1. Moreover, unlike the related art in which planar passive elements are arranged on the substrate, the conductors 51 serving as a functional element can be arranged at high density. Hence, it is highly suitable for the TSV technology intended for high-density packaging.

(Resistor)

Figure 23:
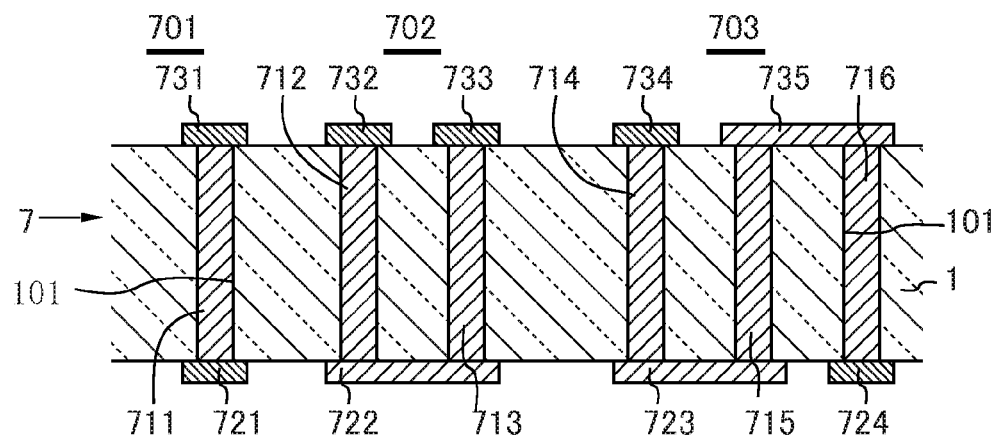
FIG. 23 is a drawing showing yet another embodiment of a substrate with built-in passive element according to the present invention.

FIGS. 23 to 27 show embodiments of a substrate with built-in resistor. At first, FIG. 23 shows an embodiment in which three resistors 701 to 703 are built therein. The first resistor 701 is formed such that a first resistive element 711 is filled in a first element forming region 101 passing through the substrate 1 in the thickness direction, and terminal electrodes 721 and 731 are disposed at opposite ends of the first resistive element 711.

The second resistor 702 is formed such that a first resistive element 712 and a second resistive element 713 are filled in two first element forming regions 101 passing through the substrate 1 in the thickness direction, and terminal electrodes 732 and 733 are disposed at the upper end of the first resistive element 712 and the upper end of the second resistive element 713 appearing on the upper surface (in the drawing) of the substrate 1, while the lower end of the first resistive element 712 and the lower end of the second resistive element 713 appearing on the lower surface of the substrate 1 are connected together through a first connecting conductor 722. The first connecting conductor 722 is not used as a terminal electrode to be connected to the outside.

The third resistor 703 is formed such that first to third resistive elements 714 to 716 are filled in three first element forming regions 101 passing through the substrate 1 in the thickness direction, and terminal electrodes 734 and 724 are disposed at the upper end of the first resistive element 714 appearing on the upper surface (in the drawing) of the substrate 1 and the lower end of the third resistive element 716 appearing on the lower surface of the substrate 1, while the lower end of the first resistive element 714 and the lower end of the second resistive element 715 appearing on the lower surface of the substrate 1 are connected together through a first connecting conductor 723, and the upper end of the second resistive element 715 and the upper end of the third resistive element 716 appearing on the upper surface of the substrate 1 are connected together through a second connecting conductor 735. Neither the first connecting conductor 723 nor the second connecting conductor 735 is used as a terminal electrode to be connected to the outside.

The resistive material may be selected from various types of known materials depending on the required characteristics. Typical examples of the resistive material include a Cu—Ni alloy, a Cu—Mn—Ni alloy and a Ni—Cr—Al alloy.

Figure 24:
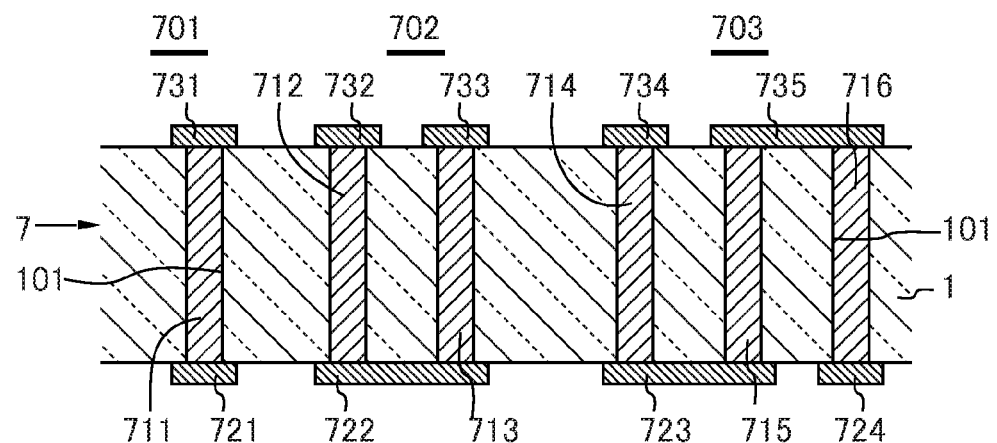
FIG. 24 is a drawing showing yet another embodiment of a substrate with built-in passive element according to the present invention.

FIG. 24 shows another embodiment in which the second resistor 702 and the third resistor 703 are slightly different from those in FIG. 23. In the second resistor 702, the lower end of the first resistive element 712 and the lower end of the second resistive element 713 appearing on the lower surface of the substrate 1 are connected together through the first connecting conductor 722, and the first connecting conductor 722 is also used as a terminal electrode to be connected to the outside.

In the third resistor 703, on the other hand, the lower end of the first resistive element 714 and the lower end of the second resistive element 715 appearing on the lower surface of the substrate 1 are connected together through the first connecting conductor 723, and the first connecting conductor 723 is also used as a terminal electrode to be connected to the outside.

Moreover, the upper end of the second resistive element 715 and the upper end of the third resistive element 716 appearing on the upper surface of the substrate 1 are connected together through the second connecting conductor 735, and the second connecting conductor 735 is also used as a terminal electrode to be connected to the outside.

Figure 25:
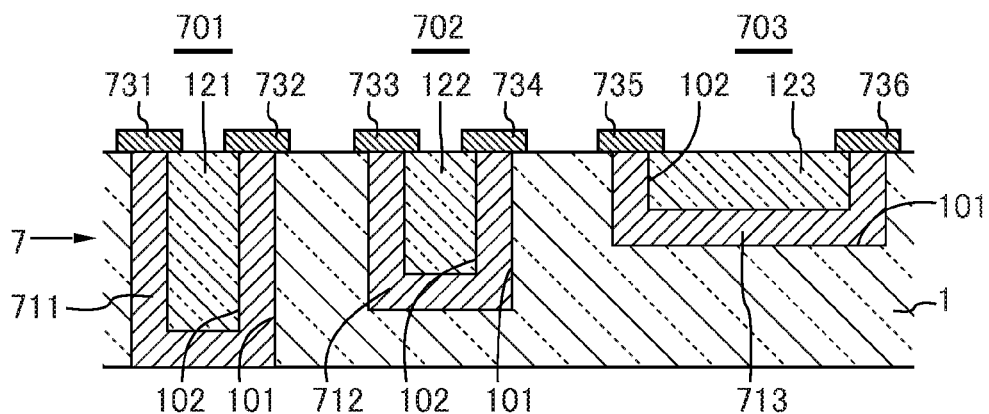
FIG. 25 is a drawing showing yet another embodiment of a substrate with built-in passive element according to the present invention.

FIG. 25 shows still another embodiment with the first resistor 701, the second resistor 702 and the third resistor 703. The first resistor 701 has a first resistive element 711 filled in a first element forming region 101 provided in the substrate 1 along its thickness direction. The first resistive element 711 is U-shaped, allowing a dielectric layer 121 to be filled in a second element forming region 102 provided at the center thereof. The second element forming region 102 is provided in the form of a blind hole, leaving the first resistive element 711 at the bottom thereof. At both sides of the dielectric layer 121, then, terminal electrodes 731 and 732 are disposed at the end faces of the first resistive element 711 appearing on the upper surface (in the drawing) of the substrate 1. Although the second resistor 702 and the third resistor 703 are also U-shaped and have the same structure as the first resistor 701, the second resistive element 712 and the third resistive element 713 have different path lengths from the first resistive element 711.

Figure 26:
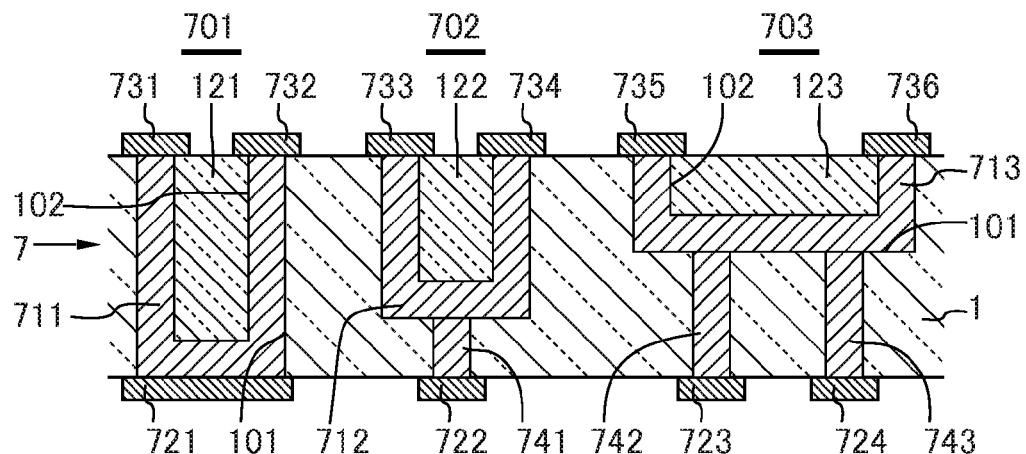
FIG. 26 is a drawing showing yet another embodiment of a substrate with built-in passive element according to the present invention.

In the embodiment shown in FIG. 26, the first to third resistors 701 to 703 have first to third resistive elements 711 to 713 filled in first element forming regions 101 provided in the substrate 1 along its thickness direction, as in the embodiment shown in FIG. 25. The first to third resistive elements 711 to 713 are excavated at the center to have second element forming regions 102, and dielectric layers 121 to 123 are filled in the second element forming regions 102. The second element forming regions 102 are provided in the form of a blind hole, leaving the first to third resistive elements 711 to 713 at the bottom thereof. At both sides of the dielectric layers, then, terminal electrodes 731 and 736 are disposed at the end faces of the first to third resistive elements 711 to 713 appearing on the upper surface (in the drawing) of the substrate 1.

In the first to third resistors 701 to 703, furthermore, the bottom parts of the first to third resistive elements 711 to 713 are connected to terminal electrodes 721 to 724 disposed at the lower surface of the substrate 1 either directly or through conductors 741 to 743 extending in the thickness direction of the substrate 1.

Figure 27:
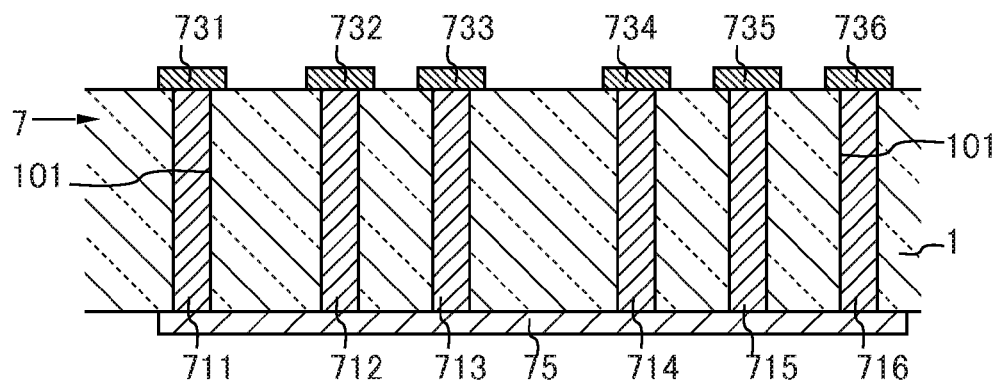
FIG. 27 is a drawing showing yet another embodiment of a substrate with built-in passive element according to the present invention.

In the embodiment shown in FIG. 27, a resistive element 75 is disposed at the lower surface of the substrate 1, where the lower ends of conductors 711 to 716 passing through the substrate 1 in the thickness direction are connected to the resistive element 75, while terminal electrodes 731 to 736 are disposed at the upper ends of the conductors 711 to 716 appearing on the upper surface of the substrate 1 in the thickness direction. The conductors 711 to 716 are arranged at prescribed intervals. Therefore, divided resistance values can be obtained from the terminal electrodes 731 to 736 depending on the connection location of the conductors 711 to 716 with respect to the resistive element 75. The conductors 711 to 716 provided in the substrate 1 along its thickness direction are functional elements constituting a divided resistor.

(Signal Transmission Element)

Figure 28:
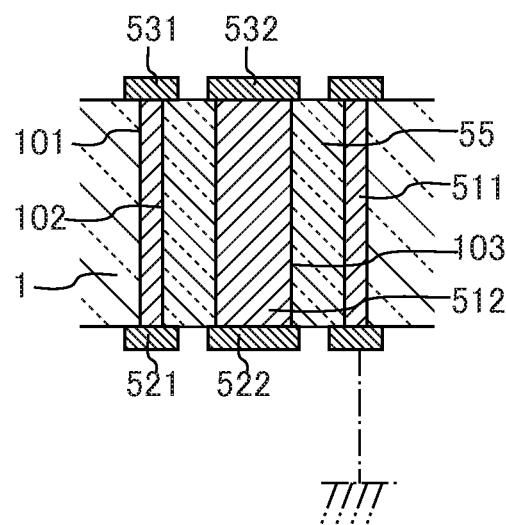
FIG. 28 is a drawing showing yet another embodiment of a substrate with built-in passive element according to the present invention.
Figure 29:
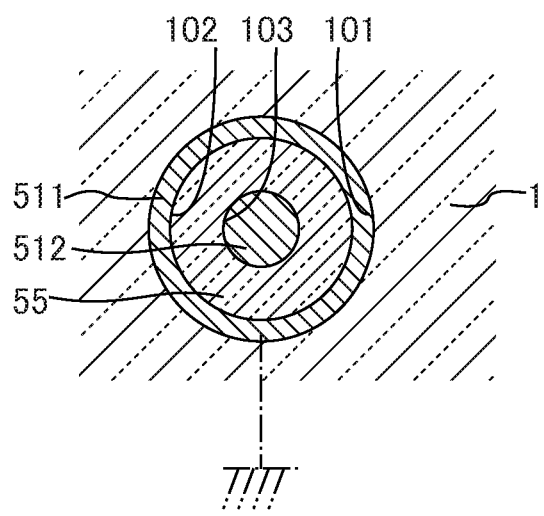
FIG. 29 is a plan view of the substrate with built-in passive element shown in FIG. 28.

As described above, the illustrated inductor may also be used as a signal transmission element. Other signal transmission elements such as coaxial line will be described below. FIGS. 28 and 29 show such a signal transmission element. As shown in these drawings, a first conductor 511 is filled in a hole-like first element forming region 101 provided in the substrate 1 along its thickness direction, a dielectric layer 55 is filled in a second element forming region 102 provided in the first conductor 511, and a second conductor 512 is filled in a third element forming region 103 provided in the dielectric layer 55 along its thickness direction. The first conductor 511 and the second conductor 512 are coaxially arranged with the ring-shaped dielectric layer 55 therebetween. Terminal electrodes 521 and 522 are disposed at opposite ends of the first conductor 511, while terminal electrodes 531 and 532 are disposed at opposite ends of the second conductor 512. Thus, there is provided a coaxial line in which the second conductor 512 is a central conductor and the first conductor 511 is an earth conductor.

Figure 30:
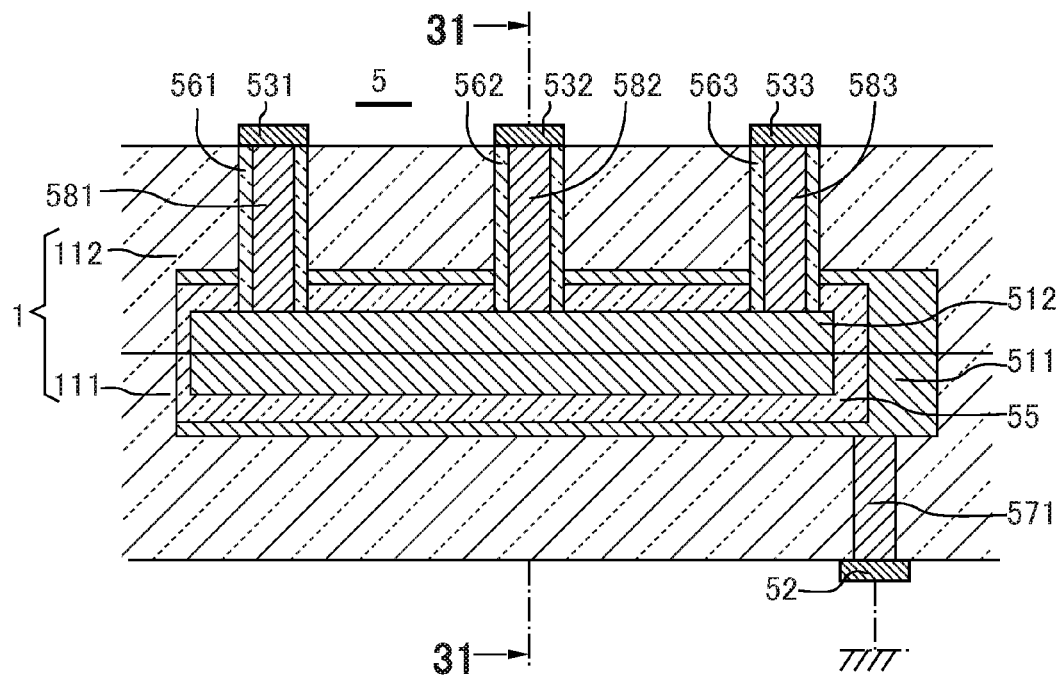
FIG. 30 is a drawing showing yet another embodiment of a substrate with built-in passive element according to the present invention.
Figure 31:
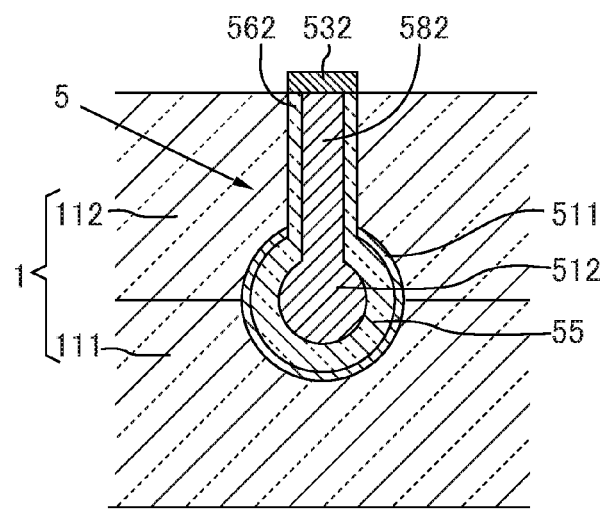
FIG. 31 is a sectional view taken along the line 31-31 in FIG. 30.

FIGS. 30 and 31 show another embodiment of the coaxial line, in which a first substrate 111 and a second substrate 112 are stacked together. The first substrate 111 and the second substrate 112 are each formed of a dielectric material with a first conductor 511, a ferroelectric layer 55 and a second conductor 512 disposed therebetween. In this coaxial line, the second conductor 512, which serves as a central conductor, is circumferentially covered with the ferroelectric layer 55, and the ferroelectric layer 55 is circumferentially covered with the first conductor 511. A plurality of lead conductors 581 to 583 are connected to the coaxial line at intervals. The lead conductors 581 to 583 extending in the first substrate 111 along its thickness direction are circumferentially covered with dielectric layers 561 to 563, respectively. Terminal electrodes 531 to 533 are disposed at the ends of the lead conductors 581 to 583.

The first conductor 511 is also led to the outside of the first substrate 111 through a lead conductor 571. A terminal electrode 52, which serves as an earth terminal, is disposed at the end of the lead conductor 571.

Figure 32:
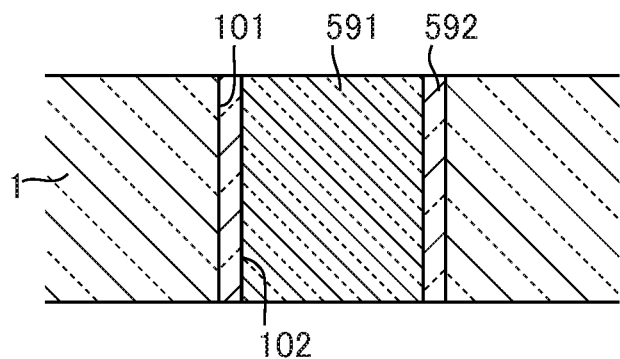
FIG. 32 is a drawing showing yet another embodiment of a substrate with built-in passive element according to the present invention.
Figure 33:
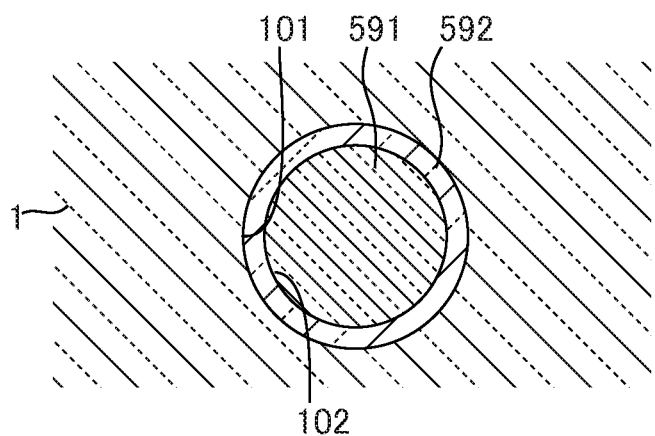
FIG. 33 is a plan view of the substrate with built-in passive element shown in FIG. 32.

FIGS. 32 and 33 further show an optical waveguide element. The optical waveguide element is provided in the substrate 1 along its thickness direction, where a core 591 with a high refractive index is circumferentially covered with a cladding layer 592 with a low refractive index, as in the optical fiber. The cladding layer 592 is filled in a first element forming region 101 provided in the substrate 1, and the core 591 is filled in a second element forming region 102 provided in the cladding layer 592.

Also in the signal transmission lines, as described above, at least one of the conductor 511, 512, the dielectric layer 55, the core 591 or the cladding layer 592 serving as a functional element thereof is embedded in the substrate 1 along its thickness direction. Therefore, the built-in signal transmission element does not increase the thickness of the substrate 1. Thus, there can be obtained a thin substrate 1 with built-in signal transmission element.

Moreover, since the conductor 511, 512, the dielectric layer 55, the core 591 and the cladding layer 592 serving as a functional element of the signal transmission element are filled in the element forming region 101, 102 or 103 provided in the substrate 1 along its thickness direction, the signal transmission element can be formed by utilizing the thickness of the substrate 1. Therefore, unlike the related art in which planar passive elements are arranged on the substrate, the signal transmission elements can be arranged at high density. Hence, it is highly suitable for the TSV technology intended for high-density packaging.

(Manufacturing Method)

Figure 34:
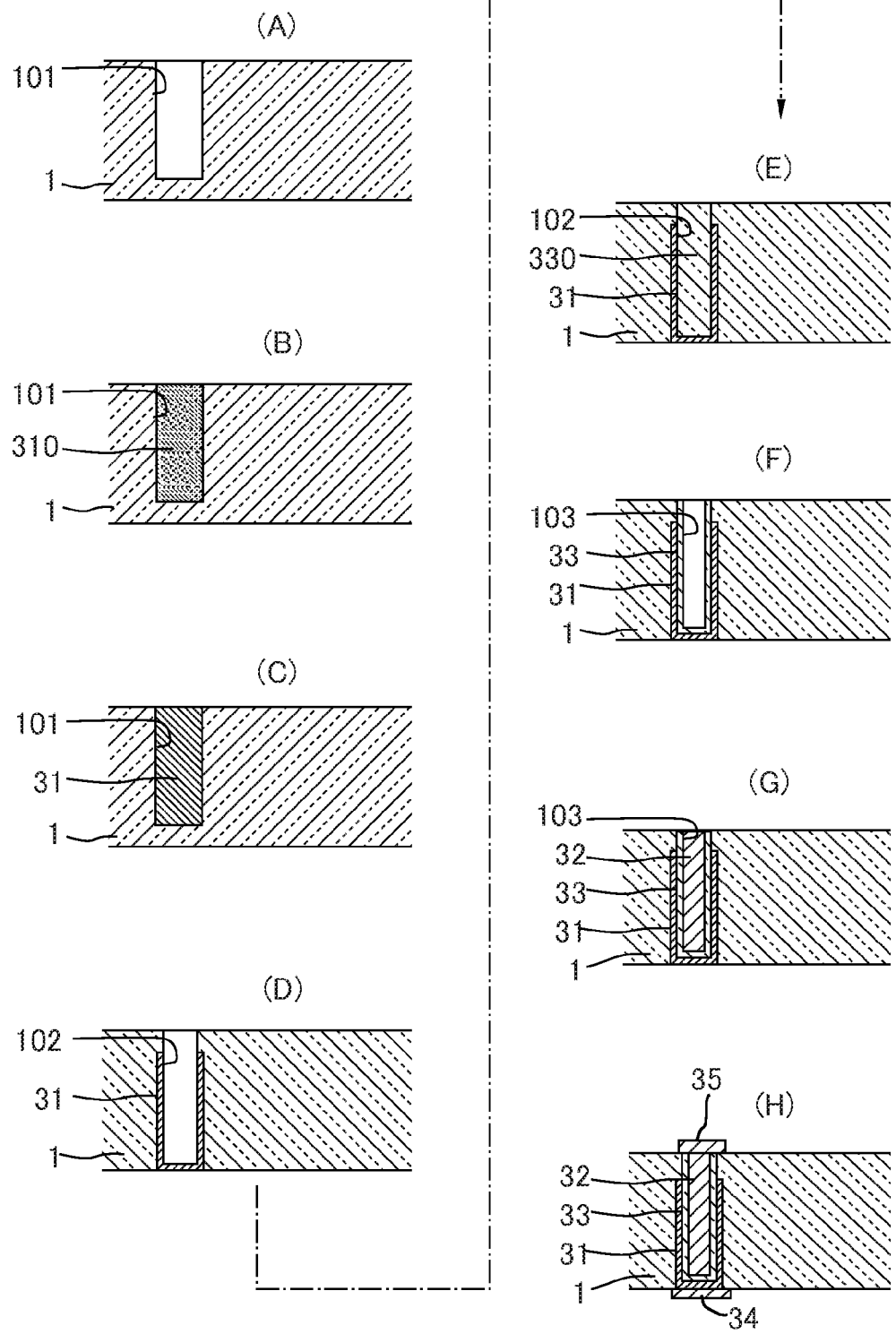
FIG. 34 is a drawing showing a method for manufacturing a substrate with built-in passive element according to the present invention.

Hereinbelow, a method for manufacturing a substrate with built-in passive element according to the present invention will be described with reference to FIGS. 34 and 35. FIG. 34 shows a process of forming a capacitor in the substrate shown in FIGS. 1 to 3. At first, as shown in FIG. 34(A), there is prepared a substrate 1 with a first element forming region 101. The first element forming region may take various forms such as a vertical hole, a horizontal hole, a strip-shaped groove, or a gap created between different members.

Then, as shown in FIGS. 34(B) and 34(C), a first conductor 31 is formed in the first element forming region 101 of the substrate 1. The first conductor 31 may be formed by a plating deposition process but is preferably formed either by a molten metal filling process in which a molten metal is poured with the first element forming region 101 used as a mold or by a metal/alloy disperse system filling process in which poured is a disperse system having a metal/alloy powder dispersed in a disperse medium. This is because significant cost reduction can be achieved in both cases. When using the molten metal filling process or the metal/alloy disperse system filling process, it is possible to adopt a differential pressure filling process, wherein the substrate 1 is placed in a vacuum chamber, the pressure is reduced by evacuation, a conductor forming filler 310 is poured into the first element forming region 101, as shown in FIG. 34(B), and then the internal pressure of the vacuum chamber is increased.

Then, the filler within the element forming region is pressurized using a pressing plate or the like and hardened by cooling under pressure. Thus, there is obtained the first conductor 31 as shown in FIG. 34(C). By adopting the molten metal filling process or the metal/alloy disperse system filling process, the growth of columnar crystal can be restrained, so that the first conductor 31 has a nanocomposite crystal structure. Since the growth of columnar crystal is restrained and the formation of equiaxed crystal is facilitated by the effect of the above nanocomposite crystal structure, stress in the first conductor 31 can be reduced.

Then, as shown in FIG. 34(D), after the substrate 1 is turned upside down, a second element forming region 102 is formed in the substrate 1 and the conductor by a CVD process, a laser drilling process, etc. It should be noted that the second element forming region 102 terminates in the first conductor 31 so as not to pass through the conductor.

Then, as shown in FIG. 34(E), a ferroelectric paste is poured into the second element forming region 102, forming a ferroelectric layer 330. Preferably, the ferroelectric paste includes ferroelectric particles of a ferroelectric material such as barium titanate, Si particles and a liquid organic Si compound. When reacted with the Si particles, the organic Si compound forms a Si—O bond around the ferroelectric particles (which serve as an aggregate), thus serving to fill up the space around the ferroelectric particles.

Preferably, the ferroelectric particles and the Si particles have a particle size of nanometer order (equal to or less than 1 μm). The ferroelectric particles and the Si particles may have any shape and should not be construed as limited to a spherical shape. Moreover, the ferroelectric particles and the Si particles are not required to have a uniform particle size but may have various particle sizes within the nanometer range.

Preferably, the reaction between the organic Si compound and the Si particles is allowed to proceed under vacuum while being heated, for example, within a temperature range of 130° C. to 150° C. Thus, the ferroelectric layer 330 can be formed as shown in FIG. 34(E). Organic substances resulting from the reaction by heating can be thermally decomposed and discharged as a gas. The ferroelectric layer 330 has a structure in which the space around the ferroelectric particles is completely filled up with the Si—O bond network, more specifically, amorphous silica (SiO$_2$).

More preferably, heating is performed such that the substances in the hole or groove (element forming region) are heated under pressure and then cooled under pressure. This process further accelerates the thermal decomposition of the organic substances and also increases the density of the ferroelectric layer 330, improving the adhesion to the substrate 1.

Moreover, the Si—O bond filling up the space around the ferroelectric particles, more specifically, the amorphous silica (SiO$_2$) can be formed by reacting the organic Si compound with the Si particles. That is, since the formation of the oxide from the Si particles increases the volume, a highly reliable ferroelectric layer 330 can be formed in the element forming region, which is free from defects such as a gap, a void or a crack and has a high adhesion strength to the side wall of the second element forming region 102. It should be noted that the volume of the SiO$_2$ increases by about 30 to 35% from that of the Si particles. This corresponds to the shrinkage ratio of the Si particles, preventing the formation of a void, a gap or a crack due to the shrinkage.

A typical example of the organic Si compound to be used in the present invention is alkylalkoxysilane represented by the formula:

In this case, the reaction formula is as follows.

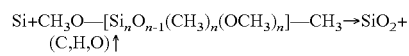

When the substrate 1 is a Si substrate, the above reaction also occurs with Si of the Si substrate. Alternatively, it is also possible to use organopolysiloxane (alkoxysilane having a functional side chain). For instance, it is Si or disiloxane having an alkoxy group (RO), where R is an organic group.

Then, as shown in FIG. 34(F), a third element forming region 103 is bored in the ferroelectric layer 330, thereby forming a ferroelectric layer 33 as a capacitance layer, and then, as shown in FIG. 34(G), a second conductor 32 is formed in the third element forming region 103. The second conductor 32 may be formed by a plating deposition process but is preferably formed either by a molten metal filling process in which a molten metal is poured with the third element forming region 103 used as a mold or by a metal/alloy disperse system filling process in which poured is a disperse system having a metal/alloy powder dispersed in a disperse medium. This is because significant cost reduction can be achieved in both cases. When using the molten metal filling process or the metal/alloy disperse system filling process, it is possible to adopt a differential pressure filling process, wherein the substrate 1 is placed in a vacuum chamber, the pressure is reduced by evacuation, a filler is poured into the third element forming region 103, and then the internal pressure of the vacuum chamber is increased.

Then, the filler filled in the third element forming region 103 is pressurized using a pressing plate or the like and hardened by cooling under pressure. This restrains the growth of columnar crystal to provide the second conductor 32 with a nanocomposite crystal structure. Since the growth of columnar crystal is restrained and the formation of equiaxed crystal is facilitated by the effect of the above nanocomposite crystal structure, stress can be reduced.

Then, as shown in FIG. 34(H), the first conductor 31 and the second conductor 32 are provided with terminal electrodes 34 and 35.

The inductor, the signal transmission element, the resistor and the optical waveguide element can also be manufactured according to the same process as described above. When the substrate 1 is a semiconductor substrate such as Si substrate and therefore has conductivity, moreover, after the first element forming region 101 is formed in the conductive substrate, an insulating paste is filled into the first element forming region 101, thereby forming the insulating layer 36 (see FIGS. 5 and 6). After the second element forming region 102 is formed in the insulating layer 36, then, the process shown in FIG. 34 is performed.

Next will be described a process of forming the inductor shown in FIG. 21 with reference to FIG. 35. At first, as shown in FIGS. 35(A) and 35(B), there is prepared a substrate 1 with first element forming regions 101. The first element forming region 101 is a blind hole.

Then, as shown in FIG. 35(C), conductors 51 are formed in the first element forming regions 101 provided in the substrate 1. The conductor 51 may be formed by a plating deposition process but is preferably formed either by a molten metal filling process in which a molten metal is poured with the first element forming region 101 used as a mold or by a metal/alloy disperse system filling process in which poured is a disperse system having a metal/alloy powder dispersed in a disperse medium. This is because significant cost reduction can be achieved in both cases. When using the molten metal filling process or the metal/alloy disperse system filling process, it is possible to adopt a differential pressure filling process, wherein the substrate 1 is placed in a vacuum chamber, the pressure is reduced by evacuation, a filler is poured into the element forming region, and then the internal pressure of the vacuum chamber is increased.

Then, the filler poured into the first element forming region 101 is pressurized using a pressing plate or the like and hardened by cooling under pressure. This restrains the growth of columnar crystal to provide the conductor with a nanocomposite crystal structure. Since the growth of columnar crystal is restrained and the formation of equiaxed crystal is facilitated by the effect of the above nanocomposite crystal structure, stress can be reduced.

Then, as shown in FIG. 35(D), a magnetic paste is filled and hardened. Preferably, the magnetic paste includes magnetic particles, Si particles and a liquid organic Si compound. The magnetic particles are formed of a magnetic metal material, a magnetic alloy material or a ferrite material. When reacted with the Si particles, the organic Si compound forms a Si—O bond around the magnetic particles (which serve as an aggregate), thus serving to fill up the space around the magnetic particles.

Preferably, the magnetic particles and the Si particles have a particle size of nanometer order (equal to or less than 1 μm). The magnetic particles and the Si particles may have any shape and should not be construed as limited to a spherical shape. Moreover, the magnetic particles and the Si particles are not required to have a uniform particle size but may have various particle sizes within the nanometer range.

Preferably, the reaction between the organic Si compound and the Si particles is allowed to proceed under vacuum while being heated, for example, within a temperature range of 130° C. to 150° C. Organic substances resulting from the reaction can be thermally decomposed and discharged as a gas. The magnetic element has a structure in which the space around the magnetic particles is completely filled up with the Si—O bond network, more specifically, amorphous silica ($SiO_2$).

More preferably, heating is performed such that the substances in the hole or groove (element forming region) are heated under pressure and then cooled under pressure. This process further accelerates the thermal decomposition of the organic substances and also increases the density of the magnetic element, improving the adhesion to the substrate 1.

Moreover, the Si—O bond filling up the space around the magnetic particles, more specifically, the amorphous silica ($SiO_2$) can be formed by reacting the organic Si compound with the Si particles. That is, since the formation of the oxide from the Si particles increases the volume, a highly reliable magnetic element can be formed in the element forming region, which is free from defects such as a gap, a void or a crack and has a high adhesion strength to the side wall of the element forming region. It should be noted that the volume of the $SiO_2$ increases by about 30 to 35% from that of the Si particles. This corresponds to the shrinkage ratio of the Si particles, preventing the formation of a void, a gap or a crack due to the shrinkage.

Then, the substrate 1 is turned upside down as shown in FIG. 35(E), and then polished by $\Delta X$ as shown in FIG. 35(F) to expose the conductor 51 and the magnetic element 110 as shown in FIG. 35(G).

Then, as shown in FIG. 35(H), the conductors 51 are connected to each other across the magnetic element 110 through connecting conductors 521 to 526 and 531 to 536, thereby forming two coils 501 and 502 wound around the magnetic element 110. Thus, the inductor (a transformer, a choke coil, etc.) shown in FIG. 21 can be obtained.

The substrates with built-in resistor shown in FIGS. 23 to 27 can also be manufactured according to the same process as described above. In this case, the resistive element may be formed by a metal/alloy disperse system filling process using a disperse system having a fine powder of a resistive material (e.g., a Cu—Ni alloy, a Cu—Mn—Ni alloy or a Ni—Cr—Al alloy) dispersed in a disperse medium.

Figure 35:
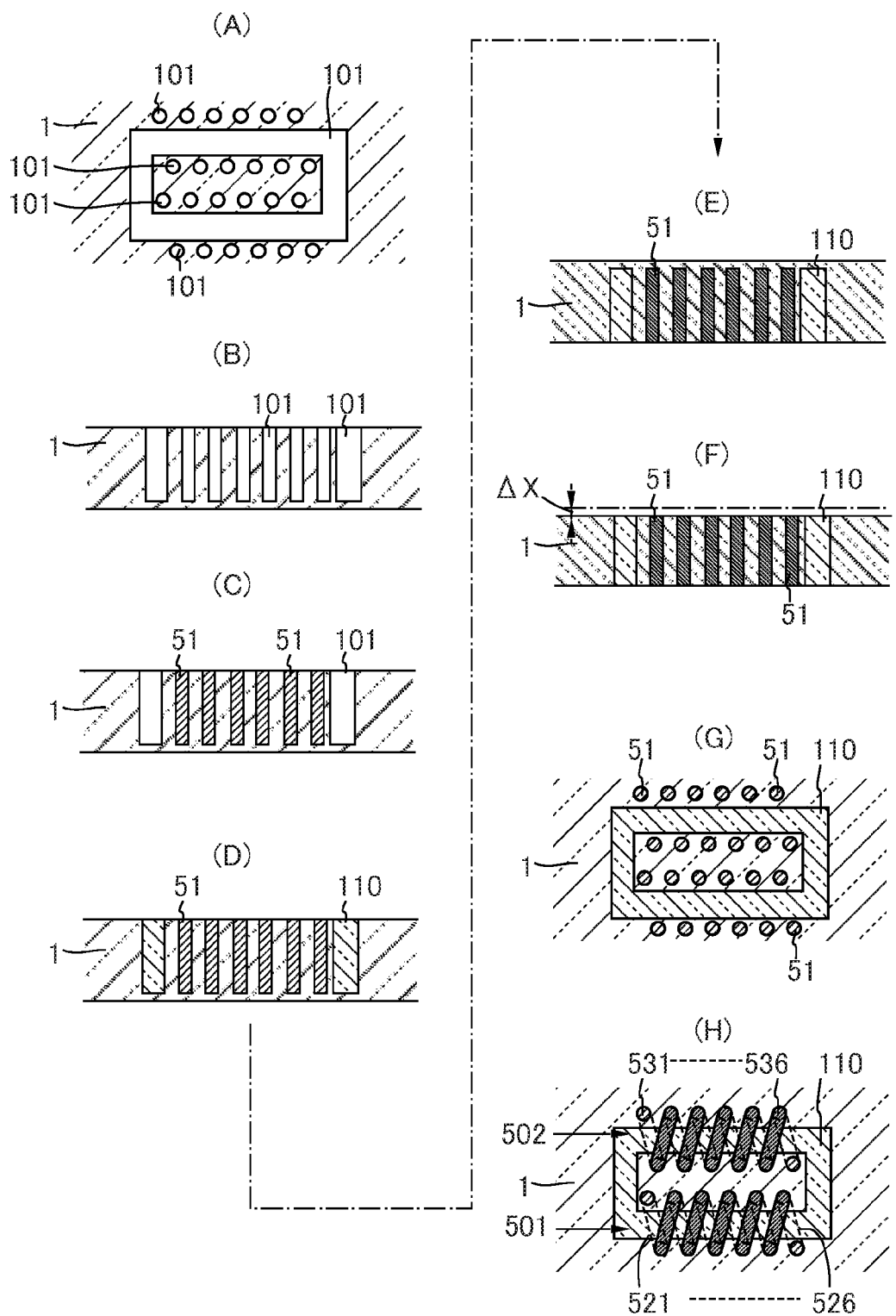
FIG. 35 is a drawing showing another embodiment of a method for manufacturing a substrate with built-in passive element according to the present invention.

The substrates with built-in signal transmission element shown in FIGS. 28 to 31 and the optical waveguide element shown in FIGS. 32 and 33 can also be manufactured according to the same process as shown in FIGS. 34 and 35.

(Others)

The substrate with built-in passive element according to the present invention can be used for realizing the 3D-SiP technology, i.e., the combination of the 3D packaging and SiP (system in package) in which a system composed of a plurality of LSIs is enclosed in a single package. Specifically, it may be applied to a substrate with passive elements needed for a system LSI, a memory LSI, an image sensor, a MEMS, etc., particularly, an interposer. It may also be applied to a system including an analog or digital circuit, a memory circuit such as DRAM, a logic circuit such as CPU, etc. It may also be applied a system obtained by preparing different types of circuits such as an analog high frequency circuit and a low frequency, low power consumption circuit in different processes and stacking them. It may also be applied to a sensor module, an optoelectronic module, a memory cell or integrated circuits (IC) thereof.

While the present invention has been particularly shown and described with respect to preferred embodiments thereof, it will be understood by those skilled in the art that various changes in form and detail may be made therein without departing from the spirit, scope and teaching of the invention.

What is claimed is:

1. A substrate with a built-in passive element comprising: a substrate having a thickness, the substrate provided with a groove-like or a hole-like element forming region formed along a direction of the thickness; and the built-in passive element provided inside the groove-like or the hole-like element forming region of the substrate, wherein the built-in passive element is selected from the group consisting of a capacitor, an inductor, a resistor, a signal transmission element and an optical waveguide element, wherein the built-in passive element comprises a functional element filled in the groove-like or the hole-like element forming region, wherein the functional element comprises functional particles, Si particles having a particle size of nanometer order, an organic Si compound, and a Si—O bond region obtained from a mixture of the Si particles with the organic Si compound, the Si—O bond forming a Si—O bond network such that the functional element is dispersed in the groove-like or the hole-like element forming region in its entirety, and wherein the functional particles is selected from the group consisting of ferroelectric particles, insulating particles, magnetic particles, and optical waveguide particles, the Si—O bond region filling up a space around the functional particles; wherein the organic Si compound is alkylalkoxysilane represented by the formula: $CH_3O$—[$Si_n O_{n-1}(CH_3)_n(OCH_3)_n$]—$CH_3$, wherein the Si—O bond forms amorphous silica ($SiO_2$) by a reaction formula below: $Si+CH_3O$—[$Si_nO_{n-1}(CH_3)_n(OCH_3)_n$]—$CH_3 \rightarrow SiO_2+(C,H,O)\uparrow$.

2. The substrate with built-in passive element of claim 1, wherein the mixture of Si particles with the organic Si compound is caused a reaction by heating.

3. The substrate with built-in passive element of claim 2, wherein the mixture of Si particles with the organic Si compound is provided homogenously before subjecting to the reaction by heating.

4. The substrate with built-in passive element of claim 2, wherein the Si particles are provided separately from the substrate before causing the reaction by heating.

5. The substrate with built-in passive element of claim 1, wherein the substrate is a semiconductor substrate.

6. The substrate with built-in passive element of claim 5, wherein the semiconductor substrate is a Si substrate.

* * * * *